United States Patent
Sengupta et al.

(10) Patent No.: US 9,685,564 B2
(45) Date of Patent: Jun. 20, 2017

(54) GATE-ALL-AROUND FIELD EFFECT TRANSISTORS WITH HORIZONTAL NANOSHEET CONDUCTIVE CHANNEL STRUCTURES FOR MOL/INTER-CHANNEL SPACING AND RELATED CELL ARCHITECTURES

(71) Applicant: Samsung Electronics Co., Ltd., Suwon-si, Gyeonggi-do (KR)

(72) Inventors: Rwik Sengupta, Austin, TX (US); Mark Stephen Rodder, Dallas, TX (US); Joon Goo Hong, Austin, TX (US); Titash Rakshit, Austin, NC (US)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 15/149,722

(22) Filed: May 9, 2016

(65) Prior Publication Data
US 2017/0110595 A1    Apr. 20, 2017

Related U.S. Application Data

(60) Provisional application No. 62/242,905, filed on Oct. 16, 2015.

(51) Int. Cl.
*H01L 29/78* (2006.01)
*H01L 29/06* (2006.01)
(Continued)

(52) U.S. Cl.
CPC .... *H01L 29/78696* (2013.01); *H01L 29/0673* (2013.01); *H01L 29/42392* (2013.01);
(Continued)

(58) Field of Classification Search
CPC ........... H01L 29/78696; H01L 29/0673; H01L 29/42392; H01L 29/66545;
(Continued)

(56) References Cited

U.S. PATENT DOCUMENTS 8,106,383 B2   1/2012   Jenkins et al.
8,199,456 B2   6/2012   Lim et al.
(Continued)

FOREIGN PATENT DOCUMENTS

WO   WO 2013/057732 A2   4/2013

OTHER PUBLICATIONS

Balendhran S. "Devices and systems based on two dimensional MoO3 and MoS2", Thesis submitted in fulfillment of the requirements for the degree of Doctor of Philosophy; School of Electrical and Computer Engineering: RMIT University; Aug. 2013, Retrieved from the internet at URL: http://researchbank.rmit.edu.au/eserv/rmit:160553/Balendhran.pdf.
(Continued)

*Primary Examiner* — Caleen Sullivan
(74) *Attorney, Agent, or Firm* — Myers Bigel, P.A.

(57) ABSTRACT

A Gate-All-Around (GAA) Field Effect Transistor (FET) can include a horizontal nanosheet conductive channel structure having a width in a horizontal direction in the GAA FET, a height that is perpendicular to the horizontal direction, and a length that extends in the horizontal direction, where the width of the horizontal nanosheet conductive channel structure defines a physical channel width of the GAA FET. First and second source/drain regions can be located at opposing ends of the horizontal nanosheet conductive channel structure and a unitary gate material completely surrounding the horizontal nanosheet conductive channel structure.

20 Claims, 4 Drawing Sheets

(51) Int. Cl.
*H01L 29/423* (2006.01)
*H01L 29/786* (2006.01)
*H01L 29/66* (2006.01)

(52) U.S. Cl.
CPC .. *H01L 29/66545* (2013.01); *H01L 29/78618* (2013.01); *H01L 29/78654* (2013.01); *H01L 29/78684* (2013.01)

(58) Field of Classification Search
CPC ......... H01L 29/78654; H01L 29/78684; H01L 29/78618
USPC ........................................................ 257/347
See application file for complete search history.

(56) References Cited

U.S. PATENT DOCUMENTS

| | | |
|---|---|---|
| 8,422,273 B2 | 4/2013 | Chang et al. |
| 8,686,428 B1 | 4/2014 | Sekar et al. |
| 8,691,324 B2 | 4/2014 | Wu et al. |
| 8,753,965 B2 | 6/2014 | Avouris et al. |
| 8,778,768 B1 | 7/2014 | Chang et al. |
| 9,123,567 B2 | 9/2015 | Radosavljevic et al. |
| 2011/0053361 A1 | 3/2011 | Muralidhar et al. |
| 2013/0069041 A1 | 3/2013 | Zhu et al. |
| 2013/0082241 A1 | 4/2013 | Kub et al. |
| 2013/0299782 A1 | 11/2013 | Afzali-Ardakani et al. |
| 2013/0313513 A1 | 11/2013 | Cappellani et al. |
| 2013/0341704 A1 | 12/2013 | Rachmady et al. |
| 2014/0051213 A1 | 2/2014 | Chang et al. |
| 2014/0063744 A1 | 3/2014 | Lopez et al. |
| 2014/0103414 A1 | 4/2014 | Koldiaev et al. |
| 2014/0138626 A1 | 5/2014 | Farmer et al. |
| 2014/0197459 A1 | 7/2014 | Kis et al. |
| 2015/0123215 A1 | 5/2015 | Obradovic et al. |
| 2015/0145042 A1 | 5/2015 | Bu et al. |
| 2015/0194489 A1 | 7/2015 | Barraud et al. |
| 2015/0243733 A1 | 8/2015 | Yang et al. |
| 2015/0364546 A1 | 12/2015 | Rodder et al. |

OTHER PUBLICATIONS

Yu et al. "Vertically stacked multi-heterostructures of layered materials for logic transistors and complementary inverters", *Nature Materials*, vol. 12, Mar. 2013, pp. 246-252, Retrieved from URL: http://www.nature.com/nmat/journal/v12/n3/full/nmat3518.html.

GATE-ALL-AROUND FIELD EFFECT TRANSISTORS WITH HORIZONTAL NANOSHEET CONDUCTIVE CHANNEL STRUCTURES FOR MOL/INTER-CHANNEL SPACING AND RELATED CELL ARCHITECTURES

CROSS-REFERENCE TO RELATED APPLICATION

This application claims priority under 35 U.S.C. §120 to U.S. Provisional Application Ser. No. 62/242,905, entitled CELL ARCHITECTURE WITH MINIMUM INTER-NS SPACE IN A HORIZONTAL PLANE BEING THE MOL SPACE, filed in the U.S. Patent and Trademark Office on Oct. 16, 2015, the disclosure of which is incorporated herein by reference in its entirety.

FIELD

The inventive concept relates generally to semiconductor devices and, more particularly, to gate all around field-effect transistor semiconductor devices with nanosheets.

BACKGROUND

Field-effect transistors (FETs), such as finFET devices, have been developed that include multiple vertical fins serving as conducting channel regions to enable larger effective conduction width in a small layout area overlying a substrate. However, as circuits are scaled to smaller dimensions and thus a smaller area, the lateral spacing between adjacent vertical fins may become too small to enable the vertical finFET devices to be formed properly. One reason for this is that it may be difficult to form the desired metal thicknesses between the adjacent fins along the height of the vertical fins.

SUMMARY

Embodiments according to the inventive concept can provide Gate-All-Around (GAA) Field Effect Transistors (FET) with horizontal nanosheet conductive channel structures for MOL/Inter-channel spacing and related cell architectures. Pursuant to these embodiments, a GAA FET can include a horizontal nanosheet conductive channel structure having a width in a horizontal direction in the GAA FET, a height that is perpendicular to the horizontal direction, and a length that extends in the horizontal direction, where the width of the horizontal nanosheet conductive channel structure defines a physical channel width of the GAA FET. First and second source/drain regions can be located at opposing ends of the horizontal nanosheet conductive channel structure and a unitary gate material completely surrounding the horizontal nanosheet conductive channel structure.

In some embodiments, a semiconductor device can include first and second Gate-All-Around (GAA) Field Effect Transistors (FETs) that include first and second horizontal nanosheet conductive channel structures, respectively. The first and second horizontal nanosheet conductive channel structures can extend in a shared horizontal plane of the first and second GAA FETs to span first and second channels of the first and second GAA FETs.

In some embodiments, a semiconductor device can include a Middle-Of-Line (MOL) spacing for a contact from an upper metallization layer to an underlying gate material, where the contact can extend between first and second directly adjacent Gate-All-Around (GAA) Field Effect Transistors (FETs), and the MOL spacing can be about equal to an inter-channel spacing between respective first and second horizontal nanosheet conductive channel structures in a horizontal direction in the semiconductor device.

DETAILED DESCRIPTION OF EMBODIMENTS

Figure 1A:
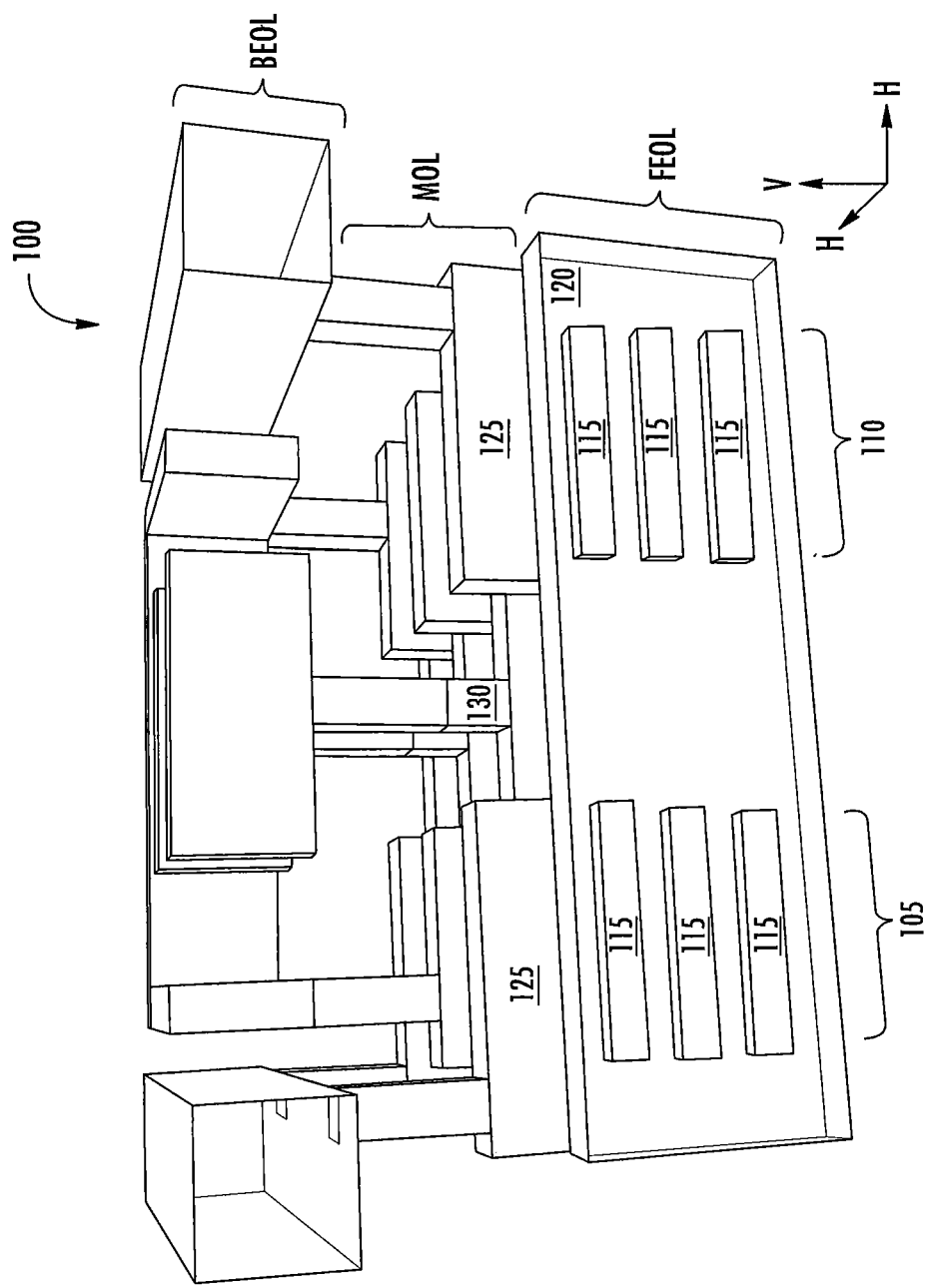
FIG. 1A is a perspective view of a cell architecture in a semiconductor device including first and second Gate-All-Around (GAA) Field-Effect Transistors (FET) with respective horizontal nanosheet conductive channel structures providing increased MOL/Inter-channel spacing for the formation of contacts to gate materials that surround the horizontal nanosheet conductive channel structures in some embodiments according to the invention.

Embodiments are described in detail with reference to the accompanying drawings. The inventive concept, however, may be embodied in various different forms, and should not be construed as being limited only to the illustrated embodiments set forth herein. Rather, these embodiments are provided as examples so that this disclosure will be thorough and complete, and will fully convey the concept of the inventive concept to those skilled in the art. Unless otherwise noted, like reference numerals denote like elements throughout the attached drawings and written description, and thus descriptions may not be repeated.

The terminology used herein is for the purpose of describing particular embodiments only and is not intended to be limiting of the inventive concept. As used herein, the singular terms "a", "an" and "the" are intended to include the plural forms as well, unless the context clearly indicates otherwise. As used herein, the term "and/or" includes any and all combinations of one or more of the associated listed items.

It will be understood that when an element such as a layer, region or substrate is referred to as being "on" another element, it can be directly on the other element or intervening elements may be present. It will be further understood that when an element such as a layer, region or surface is referred to as being "adjacent" another element, it can be directly adjacent the other element or intervening elements may be present. In contrast, the term "directly" means that there are no intervening elements. It will be further understood that the terms "comprises", "comprising", "includes" and/or "including", when used herein, specify the presence of stated features, integers, steps, operations, elements, and/or components, but do not preclude the presence or addition of one or more other features, integers, steps, operations, elements, components, and/or groups thereof.

It will be also understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present inventive concept. Example embodiments of aspects of the present inventive concept explained and illustrated herein include their complementary counterparts.

Moreover, example embodiments are described herein with reference to cross-sectional illustrations and/or plane illustrations that are idealized example illustrations. Accordingly, variations from the shapes of the illustrations as a result, for example, of manufacturing techniques and/or tolerances, are to be expected. Thus, example embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

As appreciated by the present inventive entity, devices according to various embodiments described herein may be embodied in microelectronic devices, such as integrated circuits, wherein a plurality of devices according to various embodiments described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various embodiments described herein may include a plurality of the devices in an array and/or in a two-dimensional pattern that is based on the functionality of the microelectronic device.

The devices according to various embodiments described herein may be interspersed among other devices depending on the functionality of the microelectronic device. Moreover, microelectronic devices according to various embodiments described herein may be replicated in a third direction that may be orthogonal to the two different directions, to provide three-dimensional integrated circuits.

As described herein, in some embodiments according to the invention, a Gate-All-Around (GAA) Field-Effect Transistor (FET) cell architecture can include directly adjacent spaced apart horizontal nanosheet conductive channel structures which define an inter-channel spacing between the GAA FETs to provide greater Middle-Of-Line (MOL) spacing for the formation of a contact to a gate material of the GAA FETs. For example, in some embodiments according to the invention, the channel width of each of the GAA FETs can be spanned by a single one of the horizontal nanosheet conductive channel structures. Therefore, side-by-side (or directly adjacent) GAA FETs can have greater inter-channel spacing therebetween compared to conventional approaches which use multiple side-by-side horizontal nanosheets in each of the GAA FETs. In such conventional arrangements, the use of multiple side-by-side horizontal nanosheets within a single GAA FET can require an intra-channel, gap between the horizontal nanosheets of each FET (in addition to the inter-channel spacing between directly adjacent FETs). This additional intra-channel spacing within a single FET can reduce the middle-of-line spacing available for the formation of a contact to the gate by requiring both the inter-channel spacing as well as the intra-channel spacing within the FET. Accordingly, in some embodiments according to the invention, a single horizontal nanosheet conductive channel structure can be used per horizontal plane in each of the GAA FETs to thereby eliminate any intra-channel spacing requirement within each of the GAA FETs. Accordingly, the removal of the requirement for an intra-channel spacing allows the inter-channel spacing (sometimes referred to herein in combination with the MOL spacing) to be larger in implementations having the same effective channel width as conventional arrangements.

In some embodiments according to the invention, a vertical stack of horizontal nanosheet conductive channel structures can be provided in each of the GAA FETs to increase the effective channel width in the GAA FET. In still other embodiments according to the invention, the width of respective horizontal nanosheet conductive channel structures can vary in different GAA FET arrangements. For example, in some embodiments according to the invention, a GAA FET may have a horizontal nanosheet conductive channel structure with a first width to provide a first effective channel width, whereas a second GAA FET can have a horizontal nanosheet conductive channel structure with a different width to thereby provide a different effective channel width. Still further, additional ones of the horizontal nanosheet conductive channel structures can be stacked on one another within each of the GAA FETs to increase the effective channel width provided by one of the GAA FETs while still maintaining a maximum MOL spacing. In other words, including additional horizontal nanosheet conductive channel structures in the vertical stack of a GAA FET does not necessarily decrease the MOL spacing provided for the formation of a contact to the gate.

As further provided by embodiments of the present invention, the elimination of the intra-channel horizontal nanosheet spacing, used by some conventional arrangements, can avoid the presentation of a high-aspect ratio structure which can prevent the full formation of the gate all around material due to the high-aspect ratio provided by the intra-horizontal nanosheet spacing. In contrast, the use of a single horizontal nanosheet conductive channel structure as described herein allows easier deposition of the gate all around material to extend both above, beside, as well as between each of the horizontal nanosheet conductive channel structures. Accordingly, the gate all around material provided herein can be a unitary gate material such that the gate material is formed seamlessly to surround each of the horizontal nanosheet conductive channel structures herein.

FIG. 1A is a perspective view of a cell architecture of a semiconductor device 100 including a first GAA FET 105 horizontally spaced apart from a second GAA FET 110 having an inter-channel spacing (ICS) between directly adjacent horizontal nanosheet conductive channel structures 115 located in shared horizontal planes in the semiconductor device 100.

According to FIG. 1A, each of the first and second GAA FETs 105, 110 includes a respective vertical stack of the horizontal nanosheet conductive channel structures 115. It will be understood that although the first and second GAA FETs 105, 110 are shown as including an equal number of horizontal nanosheet conductive channel structures 115, in some embodiments according to the invention, the number of horizontal nanosheet conductive channel structures in the different FETs 105, 110 can be different from one another. It will be further understood that although only two GAA FETs 105, 110 are shown in FIG. 1A, additional GAA FETs may also be provided in some embodiments according to the invention.

Each of the horizontal nanosheet conductive channel structures 115 is entirely surrounded by a gate material 120. In other words, the gate material 120 extends below, above, as well as along the vertical sides of each of the horizontal nanosheet conductive channel structures 115 so that each is completely surrounded by the gate material 120.

The horizontal nanosheet conductive channel structures 115 allocated to each of the GAA FETs 105, 110 provide an effective channel width for the respective GAA FET. In other words, the vertical stack of horizontal nanosheet conductive channel structures 115 in the first GAA FET 105 provides an effective channel width for the FET 105 which is determined by the relative widths and heights of each of the horizontal nanosheet conductive channel structures 115 in a vertical stack.

As appreciated the present inventors, using a single horizontal nanosheet conductive channel structure 115 for each horizontal plane of a GAA FET in the semiconductor device 100 can lead to the elimination of an intra-channel spacing which may be used if two or more horizontal nanosheets were used in the FET. Accordingly, the inter-channel spacing (ICS) can be maximized to allow the middle-of-line (MOL)/inter-channel spacing for the formation of the contact 130 to the gate material 120 to be maximized.

As further shown in FIG. 1A, source/drain regions 125 are provided in each of the GAA FETs 105, 110 so that the horizontal nanosheet conductive channel structures 115 can provide a channel region for the respective FET 105, 110 responsive to a potential applied to the gate material 120 between the source/drain regions 125.

As further shown in FIG. 1A, the portions therein including the horizontal nanosheet conductive channel structures 115, the gate material 120, and other portions such as a substrate therebelow, can be provided as part of a "front-end-of-line" (i.e., FEOL) process. Still further, the upper metallization, shown for example in the uppermost part of FIG. 1A can be provided as part of a "back-end-of-line" (BEOL) process. Accordingly, the contacts (including the portion 130) and the source/drain regions 125 can be provided as part of a "middle-of-line" (i.e., MOL) process. In some embodiments according to the invention, the horizontal nanosheet conductive channel structures 115 can be materials such as a nanosheet of Si, SiGe, Ge, and/or a group III-V semiconductor material, for example, InGaAs, InAs, or InSb. Other materials may also be used. In some embodiments according to the invention, the width of the horizontal nanosheet conductive channel structures 115 can be in a range of about 10 nm to about 30 nm in the H direction or plane (H). In some embodiments according to the invention, a height or thickness of the horizontal nanosheet conductive channel structures 115 can be in a range of about 2 nm to about 8 nm in the vertical direction (V). In some embodiments according to the invention, a height or thickness of the horizontal nanosheet conductive channel structures 115 can be in a range of about 3 nm to about 6 nm.

It will be understood that the gate material 120 may include a stack of materials completely surrounding each of the horizontal nanosheet conductive channel structures 115 such as a gate dielectric material, a work-function material, etc. In some embodiments according to the invention, the gate material 120 may include a work-function tuning metal layer between another gate metal layer and the dielectric. The work-function tuning metal layer may control a work function of the gate material 120 for a particular GAA FET. In some embodiments according to the invention, the first GAA FET 105 may be a p-type FET whereas the second GAA FET 110 may be an n-type FET. In some embodiments according to the invention, the first and second GAA FETs 105, 110 can be the same type.

Figure 1B:
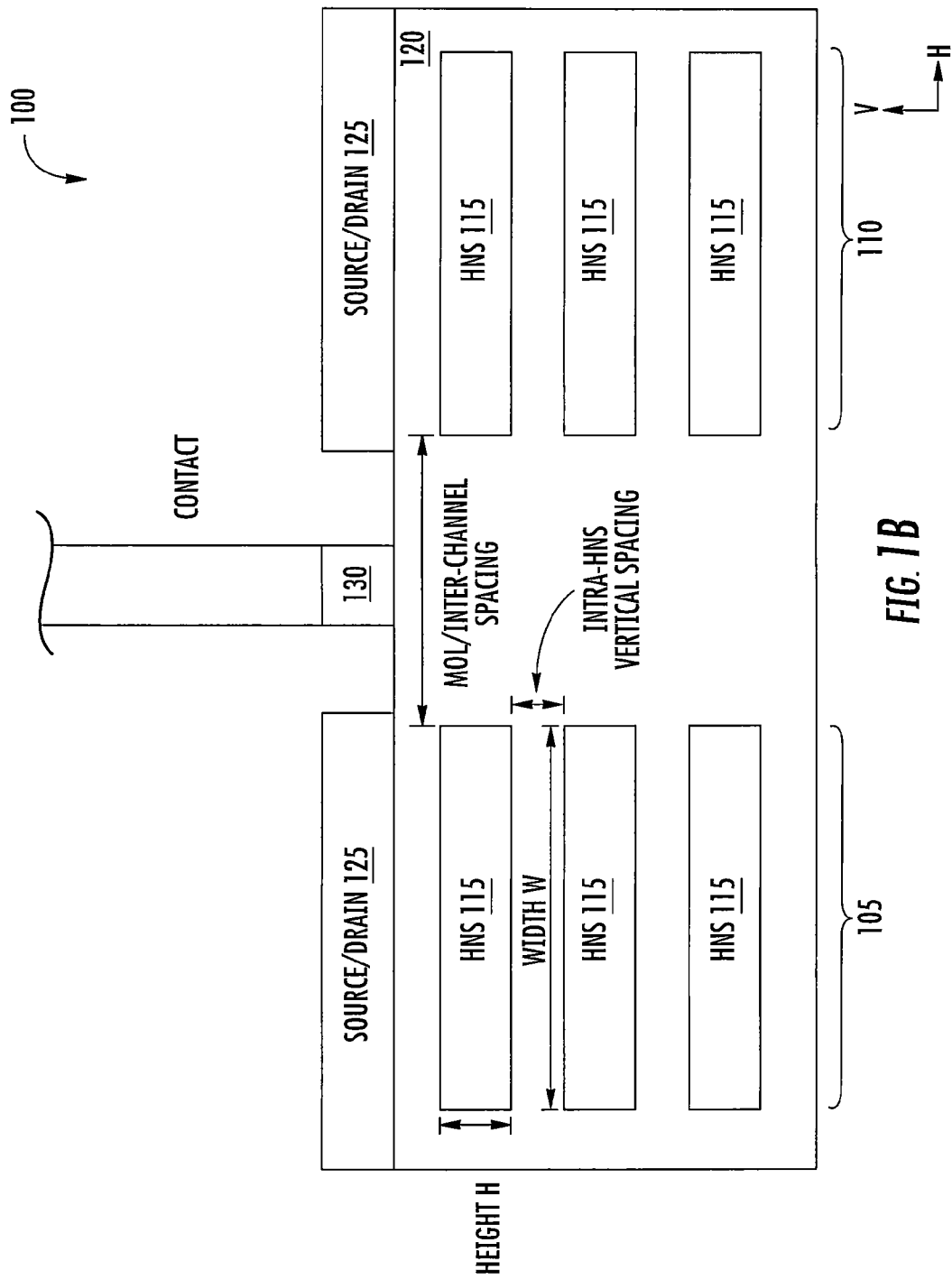
FIG. 1B is a cross-sectional view of the arrangement shown in FIG. 1A including respective vertical stacks of horizontal nanosheet conductive channel structures having an inter-channel/MOL spacing therebetween in some embodiments according to the invention.

FIG. 1B is a cross-sectional view of the first and second GAA FETs 105, 110 included in the semiconductor device 100 shown in FIG. 1A. According to FIG. 1B, the first and second GAA FETs 105, 110 can each include N vertically stacked horizontal nanosheet conductive channel structures 115. Accordingly, each of the horizontal nanosheet conductive channel structures 115 can provide a portion of the effective channel width which is defined by the cumulative perimeters of the respective horizontal nanosheet conductive channel structures 115 in each stack. For example, as shown in FIG. 1B, the width of the horizontal nanosheet conductive channel structure 115 can be defined as W whereas the height thereof can be defined as H. Therefore, the effective channel width provided for a single one of the horizontal nanosheet conductive channel structures 115 can be defined generally by the perimeter of $2 \times W + 2 \times H$. Still further, the effective channel width of the entire GAA FET can be provided by the sum of the effective channel widths for the horizontal nanosheet conductive channel structures 115 in the vertical stack.

As further shown in FIG. 1B, the width W of the horizontal nanosheet conductive channel structures 115 can span the channel width for the respective GAA FET 105, 110. For example, the physical channel width associated with the first GAA FET 105 can be defined by the width W of the horizontal nanosheet conductive channel structure 115 which spans the entire width of the channel region provided by the FET 105.

It will be understood that although each of the horizontal nanosheet conductive channel structures 115 shown in FIG. 1B is depicted as having the same width, the actual width of the horizontal nanosheet conductive channel structures 115 in each of the vertical stacks may vary according to the position at which the respective structure 115 is located. For example, a lowest one of the horizontal nanosheet conductive channel structures 115 may be wider than the width of the upper most one of the horizontal nanosheet conductive channel structures 115 due to the process used to form the GAA FETs 105 and 110.

As further shown in FIG. 1B, the inter-channel/MOL spacing between the first and second GAA FETs 105, 110 is represented by the distance between corresponding (i.e., facing) edges of directly adjacent horizontal nanosheet conductive channel structures 115 that are located in different FETs but in a shared horizontal plane of the semiconductor device 100. The MOL spacing is provided to allow the formation of the contact 130 to the gate material 120 (see also FIG. 1A).

As further shown in FIG. 1B, the inter-channel/MOL spacing may also be expressed as: $E1+S1+W+S2+E2$, where E1 is an amount by which the source/drain 125 of the first GAA FET 105 extends into the inter-channel spacing, S1 represents the distance between an edge of the source/drain 125 and a corresponding edge of the contact 130, W represents a width of the contact in the horizontal direction in which the inter-channel spacing is measured, S2 represents a distance from an opposing edge of the contact 130 to a corresponding edge of the source/drain 125 included in the second GAA FET 110, and E2 represents an amount by which the source/drain 125 of the second GAA FET 110 extends into the inter-channel space.

Figure 1C:
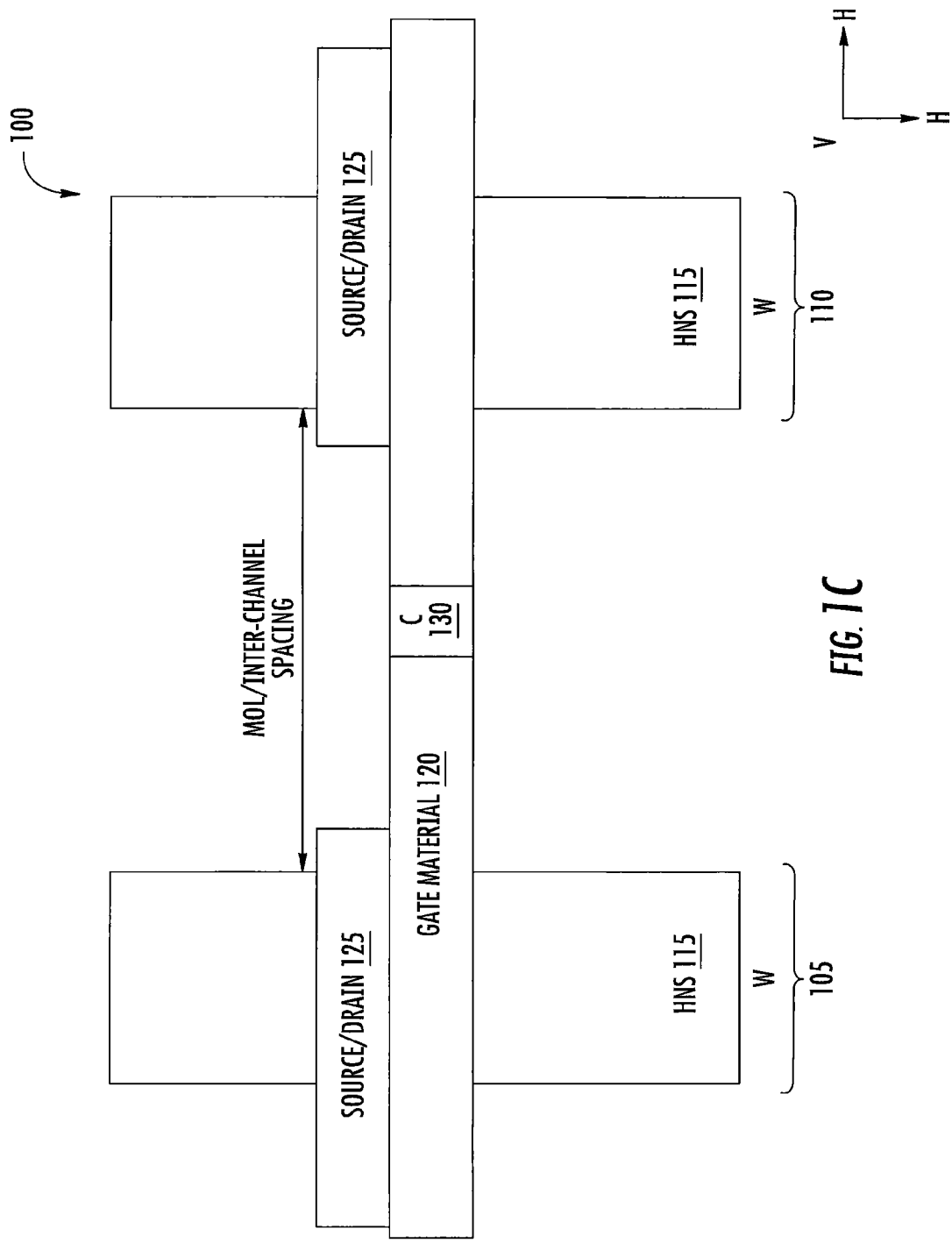
FIG. 1C is a plan view of the arrangement shown in FIGS. 1A and 1B illustrating the MOL/inter-channel spacing between the respective horizontal nanosheet conductive channel structures in some embodiments according to the invention.

FIG. 1C is a plan view showing directly adjacent horizontal nanosheet conductive channel structures 115 located in the first and second GAA FETs 105, 110 respectively, and the MOL/inter-channel spacing therebetween in some embodiments according to the invention. As further shown in FIG. 1C, the MOL/inter-channel spacing represents the distance between the directly adjacent ones of the horizontal nanosheet conductive channel structures 115 located in the first and second GAA FETs 105 and 110.

It will be understood that the term "directly adjacent" as used herein includes configurations where two "elements" (such as two GAA FETs or two horizontal nanosheet conductive channel structures) which are said to be directly adjacent to one another are positioned so that no other like element is located between the two elements which are said to be directly adjacent to one another. For example, as shown in FIG. 1C, the horizontal nanosheet conductive channel structures 115 are directly adjacent to one another in that no other horizontal nanosheet conductive channel structure 115 is located therebetween.

As further shown in FIG. 1C, the contact 130 is formed on the gate material 120 which completely surrounds each of the horizontal nanosheet conductive channel structures 115 in the first and second GAA FETs 105 and 110 as shown in FIGS. 1A and 1B.

Accordingly, the MOL spacing/inter-channel spacing can be provided in accordance with a design rule for the process used to form the semiconductor device 100 while also providing a targeted effective channel width by vertically stacking single ones of the horizontal nanosheet conductive channel structures 115 upon one another in the respective GAA FET. This may also be provided without introducing an intra-channel spacing in each of the FETs thereby avoiding a high aspect ratio structure that may otherwise be difficult to completely surround with the gate material.

In some embodiments according to the invention, the MOL/inter-channel spacing may be at least twice the vertical spacing between the horizontal nanosheet conductive channel structures 115. In still other embodiments according to the invention, the MOL/inter-channel spacing may be at least 3× the vertical spacing between the horizontal nanosheet conductive channels structures 115.

Figure 2:
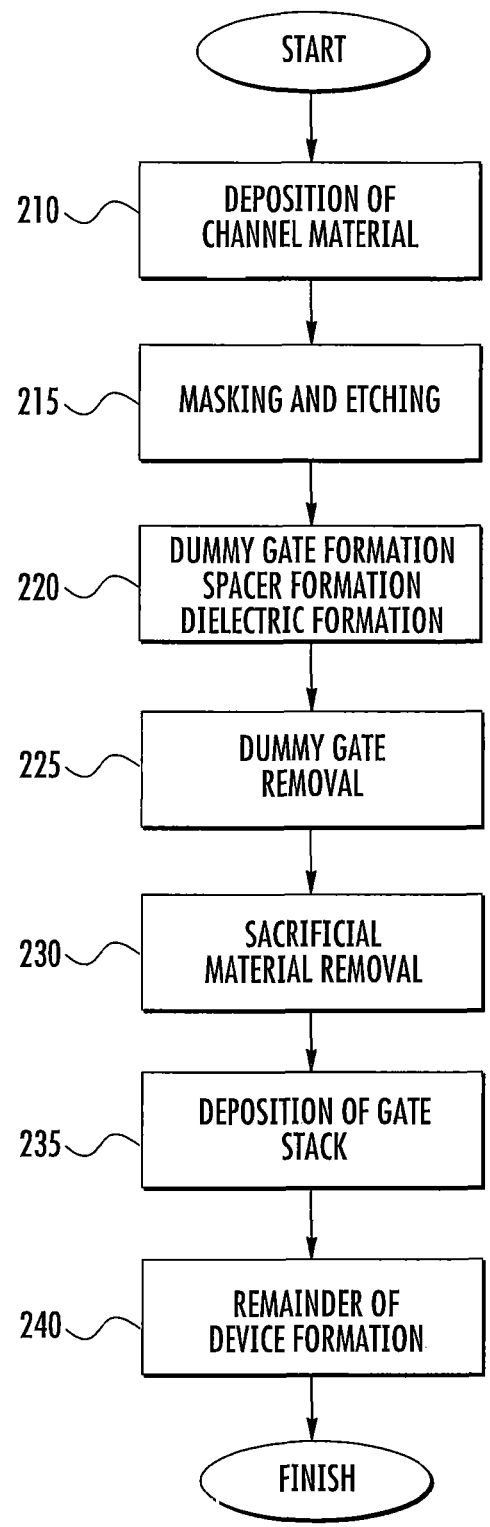
FIG. 2 is a flowchart describing formation of the GAA FET cell architecture shown in FIGS. 1A-1C in some embodiments according to the invention.

FIG. 2 is a flowchart illustrating methods of forming the GAA FETs including the horizontal nanosheet conductive channel structures 115 in some embodiments according to the invention. According to FIG. 2, a stack of conductive channel material is deposited on a substrate interspersed with intervening sacrificial material (block 210). In some embodiments according to the invention, the conductive material may be Si whereas the sacrificial material may be SiGe when an n-type FET is to be formed. Still further, SiGe may be used for the conductive channel material and Si can be the sacrificial material in the formation of a p-type FET. It will be understood that the thickness of the sacrificial material deposited may define the vertical spacing between the horizontal nanosheet conductive channel structures 115.

Masking and etching can be performed to facilitate the formation of the stacked layers (block 215). It will be also understood that masking and etching may be separately used for each type of FET formed (i.e., n-type or p-type). The stack of conductive material and sacrificial material can be patterned and etched to define the shapes of the horizontal nanosheet conductive channel structures 115. It will be understood that a single mask step or multiple mask steps may be utilized to define the width of each of the horizontal nanosheet conductive channel structures 115 in each horizontal plane of the semiconductor device 100. An etch can be used to remove both the conductive channel material and the sacrificial material to separate the horizontal nanosheet conductive channel structures 115 into different devices. Dummy gates may be formed with external and internal spacers for the subsequent support of the horizontal nanosheet conductive channel structures 115 when the dummy gate material is removed (block 220).

The dummy gate can then be removed (block 225) followed by removal of the sacrificial material from between the layers of the conductive channel material which are supported by the spacers (block 230). It will be understood that the sacrificial material may be removed via a wet etch process or a combination of wet and dry etching.

A gate stack (including the gate material) is then deposited in place of the removed dummy gate using, for example, an atomic layer deposition process (block 235). It will be understood that the formation of the gate material can be promoted to seamlessly fill between the vertical spacing of the horizontal nanosheet conductive channel structures 115 due to the absence of a high-aspect ratio region. Accordingly, the gate material can be formed as a unitary gate material, which seamlessly surrounds each of the horizontal nanosheet conductive channel structures 115 in the stack. It will also be understood that the gate stack can also include additional components, such as a gate dielectric, a gate metal, a gate work-function metal, a work-function tuning metal, and a low-resistance capping metal.

The contact 130 can then be formed to electrically connect to the gate material 120 in the inter-channel/MOL spacing provided between directly adjacent ones of the horizontal nanosheet conductive channel structures 115 as described herein. Still further, a remainder of the structures shown for example in FIGS. 1A-1C can be provided as part of a back-end-of-line process (block 240).

As described herein, in some embodiments according to the invention, a Gate-All-Around (GAA) Field-Effect Transistor (FET) cell architecture can include directly adjacent spaced apart horizontal nanosheet conductive channel structures which define an inter-channel spacing between the GAA FETs to provide greater Middle-Of-Line (MOL) spacing for the formation of a contact to a gate material of the GAA FETs. For example, in some embodiments according to the invention, the channel width of each of the GAA FETs can be spanned by a single one of the horizontal nanosheet conductive channel structures. Therefore, side-by-side (or directly adjacent) GAA FETs can have greater inter-channel spacing therebetween compared to conventional approaches which use multiple side-by-side horizontal nanosheets in each of the GAA FETs. In such conventional arrangements, the use of multiple side-by-side horizontal nanosheets can require an intra-channel gap between the horizontal nanosheets of each FET (in addition to the inter-channel spacing between directly adjacent FETs). This additional intra-channel spacing within a single FET can reduce the middle-of-line spacing available for the formation of a contact to the gate by requiring both the inter-channel spacing as well as the intra-channel spacing within the FET. Accordingly, in some embodiments according to the invention, a single horizontal nanosheet conductive channel structure can be used per horizontal plane in each of the GAA FETs to thereby eliminate any intra-channel spacing requirement within each of the GAA FETs. Accordingly, the removal of the requirement for an intra-channel spacing allows the inter-channel spacing (sometimes referred to herein in combination with the MOL spacing) to be larger in implementations having the same effective channel width as conventional arrangements.

The above-disclosed subject matter is to be considered illustrative, and not restrictive, and the appended claims are intended to cover all such modifications, enhancements, and other embodiments, which fall within the true spirit and scope of the inventive concept. Thus, to the maximum extent allowed by law, the scope is to be determined by the broadest permissible interpretation of the following claims and their equivalents, and shall not be restricted or limited by the foregoing detailed description.

What is claimed:

1. A Gate-All-Around (GAA) Field Effect Transistor (FET) comprising:
    a horizontal nanosheet conductive channel structure having a width in a horizontal direction in the GAA FET, and a height that is perpendicular to the horizontal direction, the width of the horizontal nanosheet conductive channel structure defining a physical channel width of the GAA FET;
    first and second source/drain regions located at opposing ends of the horizontal nanosheet conductive channel structure; and
    a unitary gate material completely surrounding the horizontal nanosheet conductive channel structure.

2. The GAA FET of claim 1 wherein the horizontal nanosheet conductive channel structure is included in a vertical stack of N horizontal nanosheet conductive channel structures, each of the N horizontal nanosheet conductive channel structures is located in a respective Nth horizontal plane of the GAA FET.

3. The GAA FET of claim 2 wherein each of the N horizontal nanosheet conductive channel structures provides about 1/N of an effective channel width for the GAA FET.

4. The GAA FET of claim 2 wherein each respective horizontal plane is limited to a single horizontal nanosheet conductive channel structure.

5. The GAA FET of claim 2 wherein the unitary gate material extends horizontally between ones of the N horizontal nanosheet conductive channel structures.

6. The GAA FET of claim 2 wherein a respective width of a lowest one of the N horizontal nanosheet conductive channel structures in the vertical stack is greater than a respective width of an uppermost one of the N horizontal nanosheet conductive channel structures in the vertical stack.

7. The GAA FET of claim 2 wherein the unitary gate material seamlessly surrounds each of the N horizontal nanosheet conductive channel structures.

8. The GAA FET of claim 1 wherein the horizontal nanosheet conductive channel structure comprises a first horizontal nanosheet conductive channel structure in a first GAA FET and a second horizontal nanosheet conductive channel structure in a second GAA FET that is directly adjacent to the first GAA FET, and
    wherein a space between an edge of the first horizontal nanosheet conductive channel structure and a corresponding edge of the second horizontal nanosheet conductive channel structure is about equal to a Middle-Of-Line (MOL) spacing between directly adjacent source/drain regions of the first and second GAA FETs.

9. The GAA FET of claim 8 wherein the MOL spacing comprises a design rule space for a contact to the unitary gate material between the first and second GAA FETs.

10. The GAA FET of claim 8 wherein the first horizontal nanosheet conductive channel structure is included in a vertical stack of horizontal nanosheet conductive channel structures separated by a vertical spacing such that the MOL spacing is at least twice the vertical spacing.

11. A semiconductor device comprising:
    first and second Gate-All-Around (GAA) Field Effect Transistors (FETs) including first and second horizontal nanosheet conductive channel structures, respectively, wherein the first and second horizontal nanosheet conductive channel structures extend in a shared horizontal plane of the first and second GAA FETs to span first and second channels of the first and second GAA FETs.

12. The semiconductor device of claim 11 wherein a spacing between the first and second horizontal nanosheet conductive channel structures in the shared horizontal plane is about equal to a Middle-Of-Line (MOL) spacing for a contact to a gate material extending between the first and second GAA FETs to the first and second horizontal nanosheet conductive channel structures.

13. The semiconductor device of claim 11 further comprising:
    respective first and second source/drain regions located at opposing ends of the horizontal nanosheet conductive channel structure in each of the first and second GAA FETs; and
    a gate material completely surrounding the first and second horizontal nanosheet conductive channel structures.

14. The semiconductor device of claim 11 wherein the first and second horizontal nanosheet conductive channel structures are included in a first vertical stack of N horizontal nanosheet conductive channel structures and a second vertical stack of the N horizontal nanosheet conductive channel structures, respectively, each of the N horizontal nanosheet conductive channel structures is located in a respective Nth horizontal plane of the semiconductor device shared by the first and second GAA FETs.

15. The semiconductor device of claim 14 wherein each of the N horizontal nanosheet conductive channel structures provides about 1/N of an effective channel width for one of the first and second GAA FETs.

16. The semiconductor device of claim 14 wherein each respective horizontal plane is limited to a single horizontal nanosheet conductive channel structure of one of the first and second GAA FETs.

17. The semiconductor device of claim 11 wherein first and second widths of the first and second horizontal nanosheet conductive channel structures are different.

18. A semiconductor device comprising:
    a Middle-Of-Line (MOL) spacing for a contact from an upper metallization layer to an underlying gate material, the contact extending between first and second directly adjacent Gate-All-Around (GAA) Field Effect Transistors (FETs) that include first and second horizontal nanosheet conductive channel structures, respectively, and the MOL spacing being about equal to an inter-channel spacing between the first and second horizontal nanosheet conductive channel structures in a horizontal direction in the semiconductor device.

19. The semiconductor device of claim 18 wherein the horizontal direction in the first GAA FET includes only the first horizontal nanosheet conductive channel structure and the horizontal direction in the second GAA FET includes only the second horizontal nanosheet conductive channel structure.

20. The semiconductor device of claim 19 further comprising:
 a third horizontal nanosheet conductive channel structure in a third GAA FET opposite the second horizontal nanosheet conductive channel structure, wherein an MOL spacing between the first GAA FET and the third GAA FET is equal to about an inter-channel spacing between the first and third GAA FETs.

* * * * *